(12) United States Patent
Shen et al.

(10) Patent No.: US 11,909,403 B2
(45) Date of Patent: Feb. 20, 2024

(54) LOW POWER APPARATUS AND METHOD TO MULTIPLY FREQUENCY OF A CLOCK

(71) Applicant: Intel Corporation, Santa Clara, CA (US)

(72) Inventors: Kuan-Yueh Shen, Portland, OR (US); Nasser Kurd, Portland, OR (US)

(73) Assignee: Intel Corporation, Santa Clara, CA (US)

(*) Notice: Subject to any disclaimer, the term of this patent is extended or adjusted under 35 U.S.C. 154(b) by 774 days.

(21) Appl. No.: 16/870,405

(22) Filed: May 8, 2020

(65) Prior Publication Data
US 2021/0351779 A1 Nov. 11, 2021

(51) Int. Cl.
| | |
|---|---|
| *H03L 7/08* | (2006.01) |
| *H03L 7/081* | (2006.01) |
| *H03L 7/07* | (2006.01) |
| *H03K 5/156* | (2006.01) |
| *H03L 7/087* | (2006.01) |

(52) U.S. Cl.
CPC ......... *H03L 7/0814* (2013.01); *H03K 5/1565* (2013.01); *H03L 7/07* (2013.01); *H03L 7/087* (2013.01); *H03L 7/0818* (2013.01)

(58) Field of Classification Search
CPC ... H03L 7/06; H03L 7/08; H03L 7/081; H03L 7/0812; H03L 7/0814; H03L 7/0818; H03L 7/085; H03L 7/087; H03L 7/089; H03K 5/1565; H03K 7/08; H03D 7/16; H03D 7/161; H03D 7/18; G06F 1/04; G06F 1/08
See application file for complete search history.

(56) References Cited

U.S. PATENT DOCUMENTS

| | | | | |
|---|---|---|---|---|
| 7,378,893 B1 * | 5/2008 | Kang | ...................... | H03K 5/131 327/299 |
| 9,985,618 B2 * | 5/2018 | Park | ........................ | H03L 7/093 |

OTHER PUBLICATIONS

Kong, L. et al., "A 2.4GHz 4mW Inductorless RF Synthesizer", IEEE ISSCC, pp. 450-451, 2015.
(Continued)

*Primary Examiner* — Long Nguyen
(74) *Attorney, Agent, or Firm* — NICHOLSON DE VOS WEBSTER & ELLIOTT LLP

(57) ABSTRACT

A multi-feedback circuit that compares a duty cycle corrected reference clock $f_{REF}$, and controls a number of identical delay lines to generate a new clock with a frequency that is a multiple (e.g., 32×, 4×, etc.) of the frequency of $f_{REF}$ with approximately 50% duty cycle (DC). The new clock is used as a reference clock to a phase locked loop (PLL) or a multiplying delay locked loop (MDLL) resulting in shorter lock times for the PLL/MDLL, higher bandwidth for the PLL/MDLL, lower long-term output clock jitter. The multi-feedback circuit can also be used as a low power clock generator.

15 Claims, 9 Drawing Sheets

(56) References Cited

OTHER PUBLICATIONS

Megawer, K. et al., "A 5GHz 370fsrms 6.5mW clock multiplier using a crystal-oscillator frequency quadrupler in 65nm CMOS", A 5GHz 370fsrms 6.5mW clock multiplier using a crystal-oscillator frequency quadrupler in 65nm CMOS, IEEE ISSCC, pp. 392-394, 2018.

Park, D. et al., "A 14.2 mW 2.55-to-3 GHz Cascaded PLL with Reference Injection and 800 MHz Delta-Sigma Modulator in 0.13 μm CMOS", IEEE J. Solid-State Circuits, vol. 47, No. 12, pp. 2989-2998, 2012.

Song, F. et al., "A Fractional-N Synthesizer with 110fsRMS Jitter and a Reference Quadrupler for Wideband 802.11ax", IEEE ISSCC, pp. 264-266, 2019.

\* cited by examiner

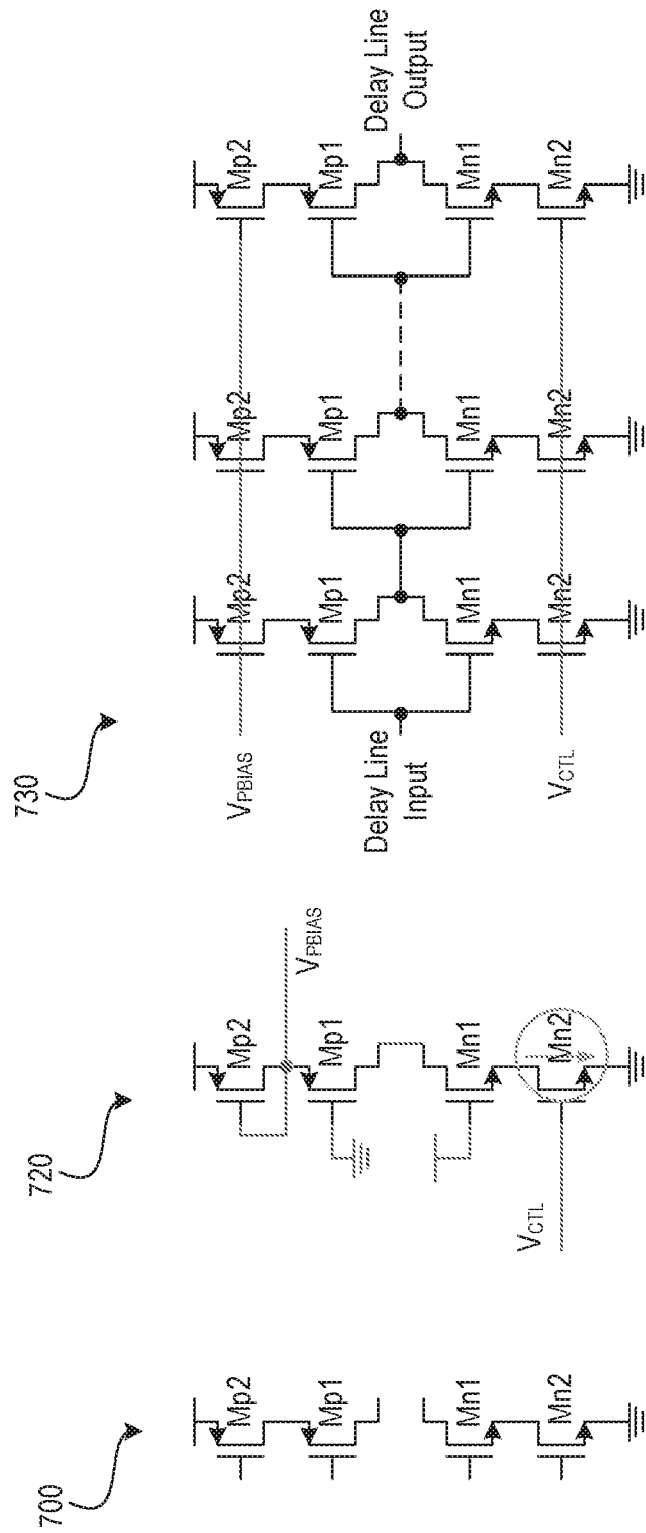

LOW POWER APPARATUS AND METHOD TO MULTIPLY FREQUENCY OF A CLOCK

BACKGROUND

An external crystal (XTAL) provides a root reference clock frequency to a phase locked loop (PLL) of a processor. The reference clock frequency is generally limited to no more than 100 MHz for power consumption, phase noise, and cost considerations. An off-die XTAL of 38.4 MHz is widely accepted across many computer platforms. For any of the PLLs of the processor, its input reference clock frequency ($f_{REF}$) sets its maximum stable loop bandwidth (approximately 10% of $f_{REF}$). The higher the PLL bandwidth, the shorter the settling and/or lock time and lower the long-term PLL output clock jitter. However, the low root reference clock frequency results in lower PLL bandwidth. A lower PLL bandwidth filters less of PLL's oscillator noise, and increases the PLL lock and/or settling time. For a given PLL output frequency, low $f_{REF}$ increases the feedback divider ratio (N), thus 1) increasing the noise of a phase frequency detector (PFD) and charge pump of the PLL, and 2) increasing quantization noise of a divider of the PLL because of noise introduced by a delta-sigma modulator in the fractional-N mode of the divider. Lower $f_{REF}$ also leads to a higher loop filter capacitance and its layout area, given a fixed minimum charge pump current in the charge pump of the PLL.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 7A-C illustrate a shared building block for a bias generator and delay lines, bias generation circuit, and delay-line configuration, respectively, in accordance with some embodiments.

DETAILED DESCRIPTION

Figure 1:
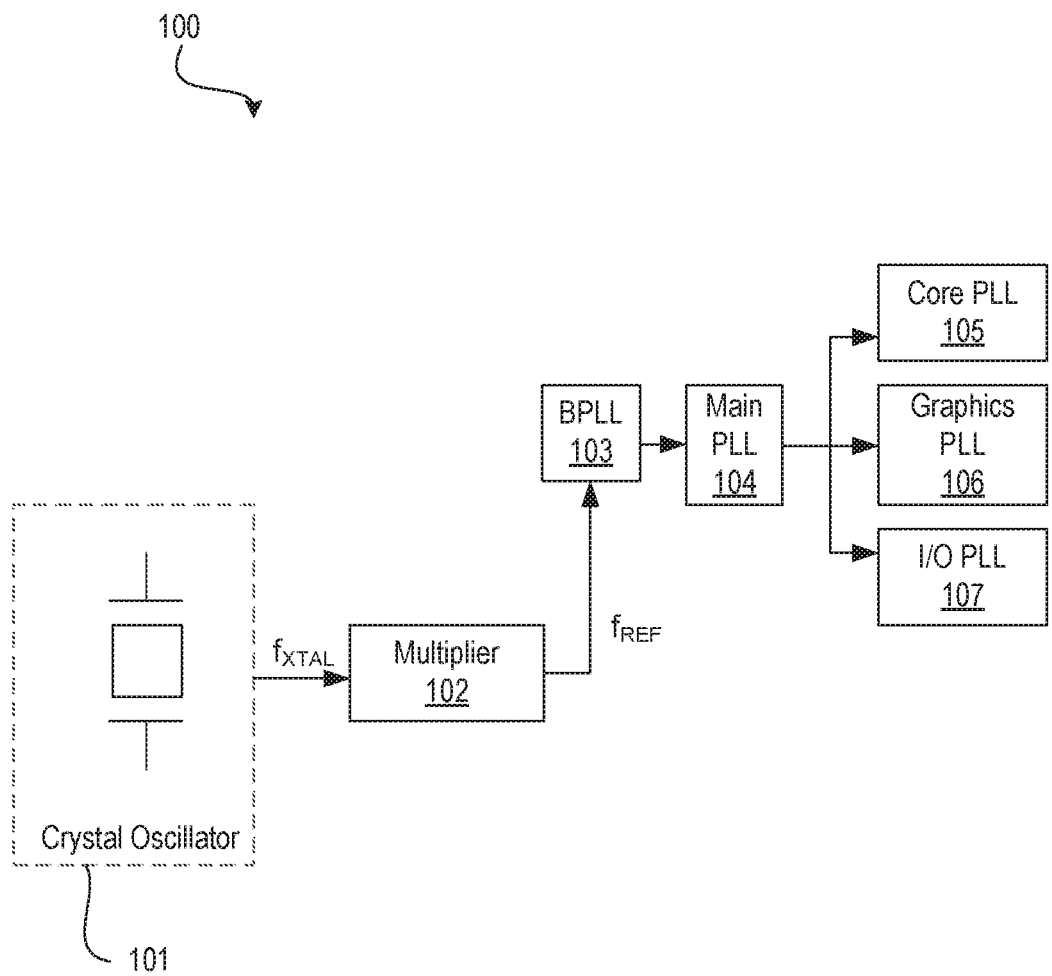
FIG. 1 illustrates a simplified clocking architecture with a multiplier to increase a root reference clock frequency to a first phase locked loop (PLL), in accordance with some embodiments.

An integer-N PLL can be inserted between a first PLL of a processor and the quartz crystal to convert XTAL frequency to a higher $f_{REF}$ for a following fractional-N PLL. However, in this case the overall power-area-jitter trade-offs are usually complicated. For example, cascading two PLLs where the integer-N PLL converts a 50 MHz $f_{REF}$ to 800 MHz using reference injection locking, and the subsequent fractional-N loop bandwidth is set to 1 MHz, or 1/800 times its input reference, overall consumes 14.2 mW for a 3 GHz output with sub-picoseconds integrated RMS (root mean square) jitter and 0.5 mm² area in 130 nm complementary metal oxide semiconductor (CMOS) process technology node. So, inserting another frequency synthesizer, for instance a PLL, between the first PLL and the quartz crystal adds cost of its power, area, lock time, settling time, and self-introduced jitter to the clock synthesis. Here, integer-N PLL refers to a PLL with integer divider ratio while fractional PLL refers to a PLL with fractional divider ratio.

For PLLs of same intellectual property (IP) and that want minimal individual configuration change among them, architects may use the greatest common divisor of different $f_{REF}$'s as the internal $f_{REF}$ substitute in the feedback loop. For example, if a first PLL and a parallel second PLL take 133.33 MHz and 100 MHz input, respectively, one can divide the two inputs down to 33.33 MHz as the common, post-divider input reference clock. This lowers the internal reference clock rate by 4× and 3×, respectively. Thus, it is desirable to have a simple circuit that doubles or quadruples the internal $f_{REF}$ to recover the deficiency described above.

Some embodiments describe a multi-feedback circuit that compares a duty cycle corrected reference clock $f_{REF}$, and controls a number of identical delay lines to generate a new clock with a frequency that is a multiple (e.g., 2×, 4×, etc.) of the frequency of $f_{REF}$ with approximately 50% duty cycle (DC). The new clock is used as a reference clock to the first PLL or a multiplying delay locked loop (MDLL) resulting in shorter lock times for the PLL or multiplying delay locked loop (MDLL), higher bandwidth for the PLL/MDLL, and lower long-term output clock jitter. The multi-feedback circuit can also be used as a low power clock generator. Doubling $f_{REF}$ can reduce the PLL in-band noise by 6 dB for a first order delta-sigma modulator (DSM), and more reduction for a higher order DSM, for example. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" here generally refers to any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described are in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a simplified clocking architecture 100 with a multiplier to increase a root reference clock frequency to a first phase locked loop (PLL), in accordance with some embodiments. Architecture 100 comprises crystal oscillator 101 (e.g., a quartz oscillator), multiplier 102, first PLL 103 followed by multiple PLLs including PLLs 104, 105, 106, and 107. While four PLLs are shown here, any number of PLLs in any configuration can be organized in a processor to satisfy clocking needs of the processor.

In this example, first PLL 103 is referred to as a BCLK PLL which receives the multiplied root reference clock frequency $F_{REF}$ and provides a higher frequency reference clock to the main PLL 104. The output of main PLL 104 is then used as reference clock for subsequent PLLs including processor core PLL 105, graphics unit PLL 106, and I/O (input/output) PLL 107. In various embodiments, multiplier 102 receives the output clock $f_{XTAL}$ of crystal oscillator 101 and multiplies it by 2×, 4×, etc. as root reference clock $f_{REF}$. In various embodiments, multiplier 102 comprises a multi-feedback circuit that compares a duty cycle corrected reference clock $f_{REF}$, and controls a number of identical delay lines to generate a new clock with a frequency that is a multiple (e.g., 2×, 4×, etc.) of the frequency of $f_{REF}$ with approximately 50% duty cycle (DC).

Multiplier 102 comprises a duty cycle correction (DCC) circuit at its input to correct the duty cycle of clock $f_{XTAL}$ to 50% or substantially 50%. The DCC circuit receives a first clock $f_{XTAL}$ having a frequency to generate an output which is substantially corrected for duty cycle error. The output of the DCC is compared by a first XOR (or XNOR) gate (or a first digital comparator) along with a delayed version of the output of DCC. The delayed version is a 90 degree phase shifted output of the DCC. The delayed version of the output of DCC is generated by a first adjustable or tunable delay line.

A second delay line takes the output of the first adjustable or tunable delay line and generates another delayed version which is 90 degrees (or substantially 90 degrees) phase shifted, thus producing a 180 degree (or substantially 180 degree) phase shifted output relative to the phase of the output of the DCC. A third adjustable delay line delays the output of the first XOR gate to generate an output which is 135 degrees (or substantially 135 degrees) out of phase relative to the output of the DCC. A second XOR (or XNOR) gate (or a second digital comparator) compares the output of the first XOR gate and the output of the third tunable delay line, to generate a clock $f_{REF}$ which is four times the frequency of the clock $f_{XTAL}$.

An inverted version of the 180 degree phase shifted output (e.g., a 360 degree phase shifted output) and the output of the DCC are compared by a phase frequency detector which generates UP or Down (DN) indicating the phase relationship between the two inputs of the PFD. The UP and/or DN signals from the PFD are used to adjust the delay setting of the first, second, and third tunable delay lines to improve the duty cycle error. In various embodiments, multiplier 102 (or multiplier circuitry 102) comprises a finite state machine (FSM) to receive a phase error from the phase frequency detector and to generate one or more bits to control delays of the first and second delay lines (and/or the third delay line) in accordance with the phase error.

Figure 2A:
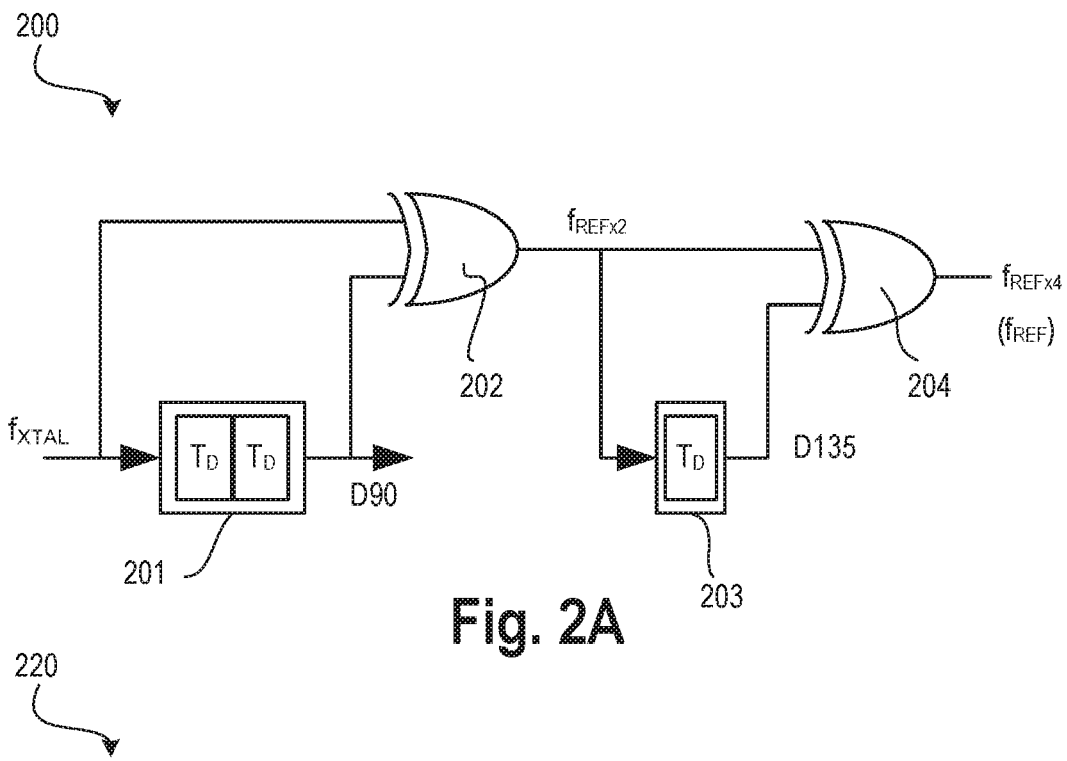
FIGS. 2A-B illustrate a building block of the multiplier, and associated timing diagram, respectively, in accordance with some embodiments.
Figure 2B:
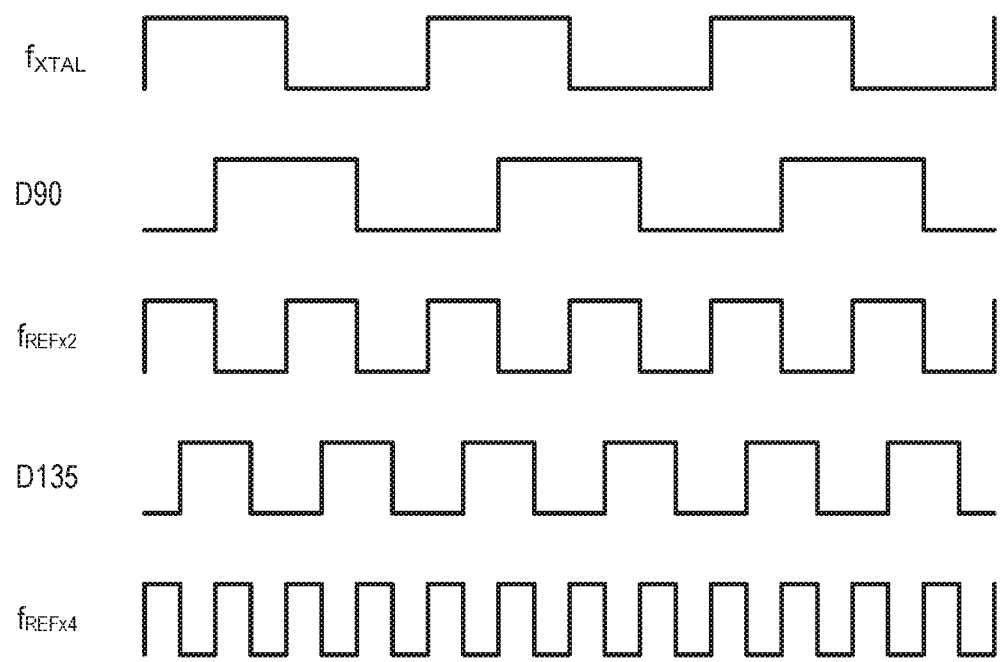

FIGS. 2A-B illustrate building block 200 of multiplier 102, and associated timing diagram 220, respectively, in accordance with some embodiments. Building block 200 of multiplier 102 comprises a first tunable delay line 201, first XOR gate 202, a second tunable delay line 203, and second XOR gate 204 (or comparing logic) coupled as shown. In this example, first tunable delay line 201 comprises two delay cells, each delay cell having a delay $T_D$, while second tunable delay line 203 comprises one delay cell. As such, delay of second tunable delay line 203 is half (or substantially half) of the total delay of first tunable delay line 201.

Figure 3:
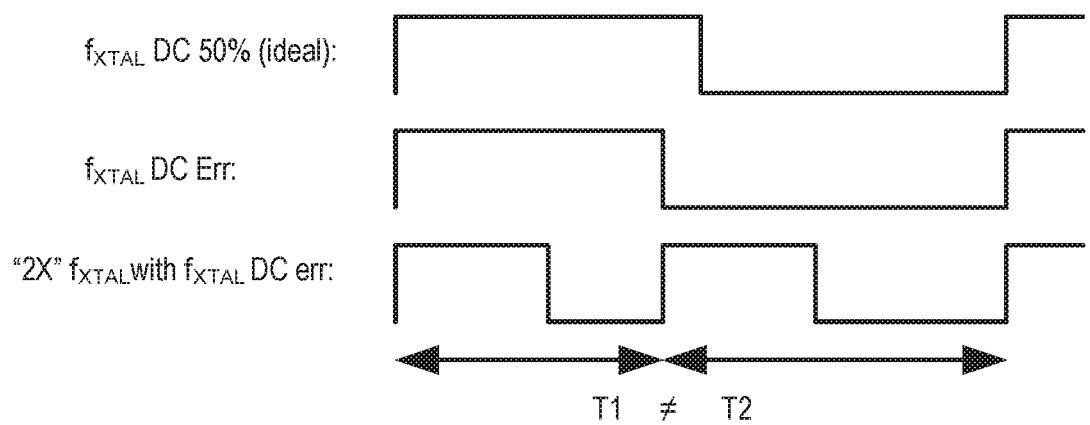
FIG. 3 illustrates a timing diagram showing a reference clock with DC (Duty Cycle) error and consequence at its 2× frequency output.

When each $T_D$ adds 45° phase (or substantially 45 degree phase) with respect to the reference clock $f_{REF}$ which has 50% duty cycle (or substantially 50% duty cycle), then the XORs 202 and 204 double and quadruple $f_{REF}$, respectively. In some embodiments, the 50% duty cycle clock $f_{REF}$ can be achieved using a duty cycle correction circuitry (DCC). In some embodiments, a DCC is also applied to the output of crystal oscillator 101 that provides, for example, 40 MHz reference clock $F_{XTAL}$. One reason for adding the DCC at the input of multiplier 102 is because when an input duty cycle (DC) error exists, a frequency doubler can produce two different periods per input reference clock cycle, illustrated in FIG. 3. FIG. 3 illustrates a timing diagram 300 showing a reference clock with DC error and consequence at its 2× output. These two different periods per input reference clock cycle cause two frequency spurs around $f_{REF}$ in phase noise and output frequency spectrum. Although the spurs are suppressed by a following PLL 103, it desirable to minimize the spurs. Therefore, with a DCC installed up-front, multiplier 102 addresses how to tune the $T_D$ for +45° across PVT (process, voltage, and temperature) variations. Timing diagram 220 illustrates waveforms at nodes with delay $T_D$. Here, D90/D135 means to add 90°/135° phase delay, respectively, relative to $f_{REF}$.

Figure 4A:
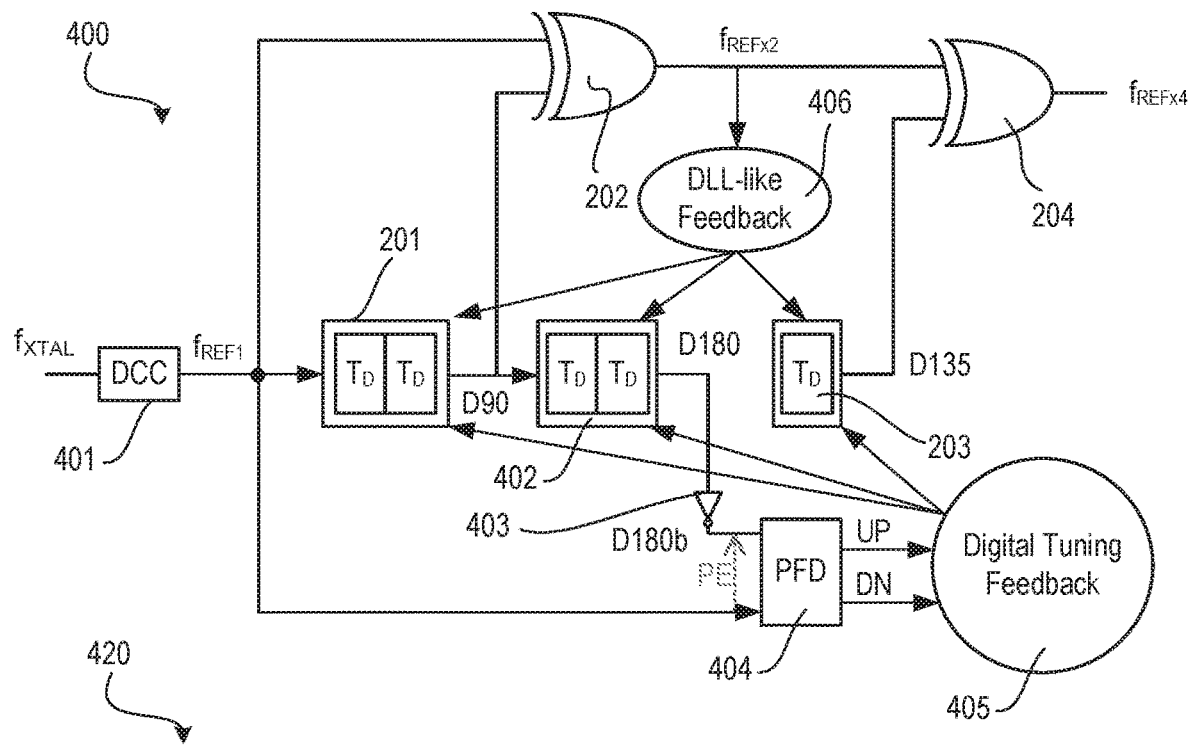
FIGS. 4A-B illustrate a high-level schematic of the multiplier, and associated timing diagram, respectively, in accordance with some embodiments.
Figure 4B:
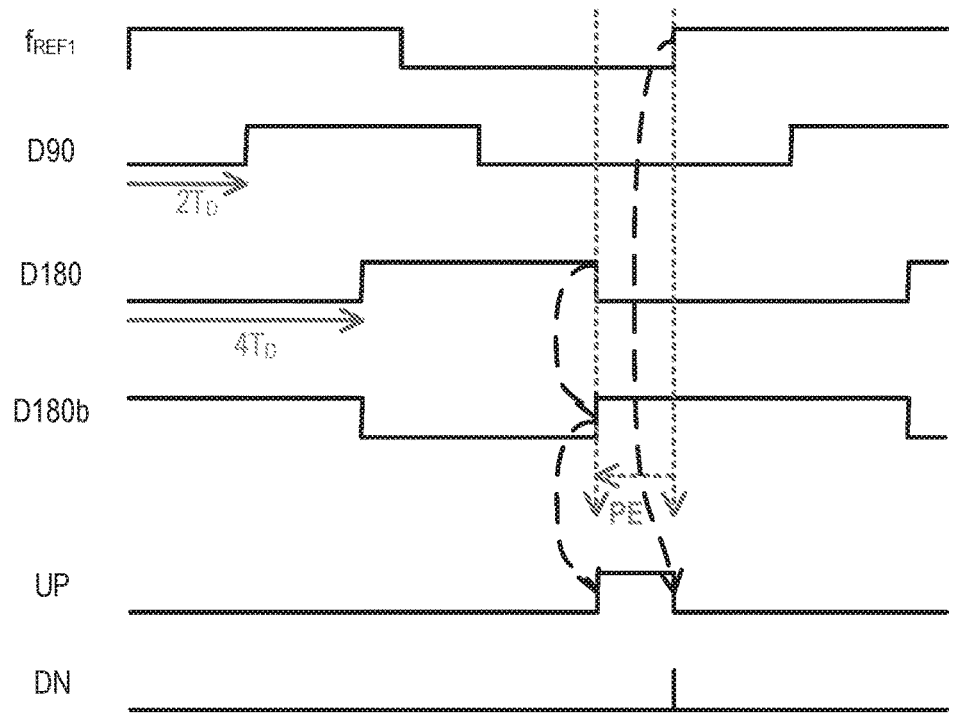

FIGS. 4A-B illustrate a high-level schematic 400 of multiplier 102, and associated timing diagram 420, respectively, in accordance with some embodiments. Compared to the simplified building block 200 of FIG. 2A, here DCC 401 is added at the output of crystal oscillator 101, an additional tunable delay line 402 with delay $2T_D$ is added at the output of the first tunable delay line 201, an inverter 403 is added at the output of delay line 402 (also referred to as the second additional tunable delay line 402), PFD 404 at the output of the inverter 403 and the output of DCC 401, digital tuning feedback circuitry 405 at the output of the PDF 404, and DLL-like feedback circuitry 406. Tunable delay line 402 has same delay (or substantially same delay) as delay line 201. In some embodiments, tunable first delay line 201, second delay line 403, and third delay line 203 comprise one or more delay stages, wherein an individual delay stage includes degenerative n-type or p-type devices.

The input $f_{XTAL}$ is first adjusted by DCC 401 to obtain 50% duty cycled $f_{REF1}$. Then two feedback loops 405 and 406 are introduced to handle the 45° $T_D$ tuning. These two feedback loops are digital turning feedback circuitry 405 and DLL-like fine-tuning feedback 406. The loop including circuitry 406 tunes $f_{REFx2}$ waveform toward 50% duty cycle (or substantially 50% duty cycle). This loop may not be aware of the duty cycle error. If the duty cycle error at $f_{REFx2}$ exceeds a certain threshold at steady state, the loop including circuitry 405 running in the background with a low activity factor, detects the duty cycle error and corrects it. To detect the duty cycle error, the loop including circuitry 405 compares $f_{REF1}$ and D180b (which is an inverse of D180 and equivalent to D360). D180b is created by adding $2T_D$ (=D180) to D90 and then inverting the output of D180 by inverter 403.

As shown in timing diagram 420, the phase/frequency comparison by PFD 404 checks how far the falling edge of D180 is away from rising edge of $f_{REF1}$ per $1/f_{REF1}$ cycle as the phase error (PE). The PE contains not only the amount of duty cycle deviation but the sign of duty cycle error at $f_{REFx2}$. To correct this duty cycle error, an FSM (not shown) can increase or decrease the number of active transistors inside $T_D$'s delay stages 201, 402, and 203 according to the PFD UP and DN signals. Through the two feedback loops (including digital tuning feedback circuitry 405 and DLL-like feedback 406) that control $T_D$, both clocks at $f_{REFx2}$ and $f_{REFx4}$ achieve very low DC error (e.g., substantially zero) at steady state.

Depending on the tolerance of reference spurs around $f_{REF}$ and $f_{REFx2}$ as well as the resolution of the digital tuning loop comprising circuitry 405, circuitry 405 and its associated feedback loop itself may be sufficient to correct duty cycle errors without circuitry 406 and its associated DLL-like feedback loop, in accordance with some embodiments. In some embodiments, instead of circuitry 405 and its digital tuning feedback, circuitry 406 and its digital tuning feedback loop and another DCC at $f_{REFx2}$ to fix DC errors for $f_{REFx4}$ may be sufficient.

Figure 5:
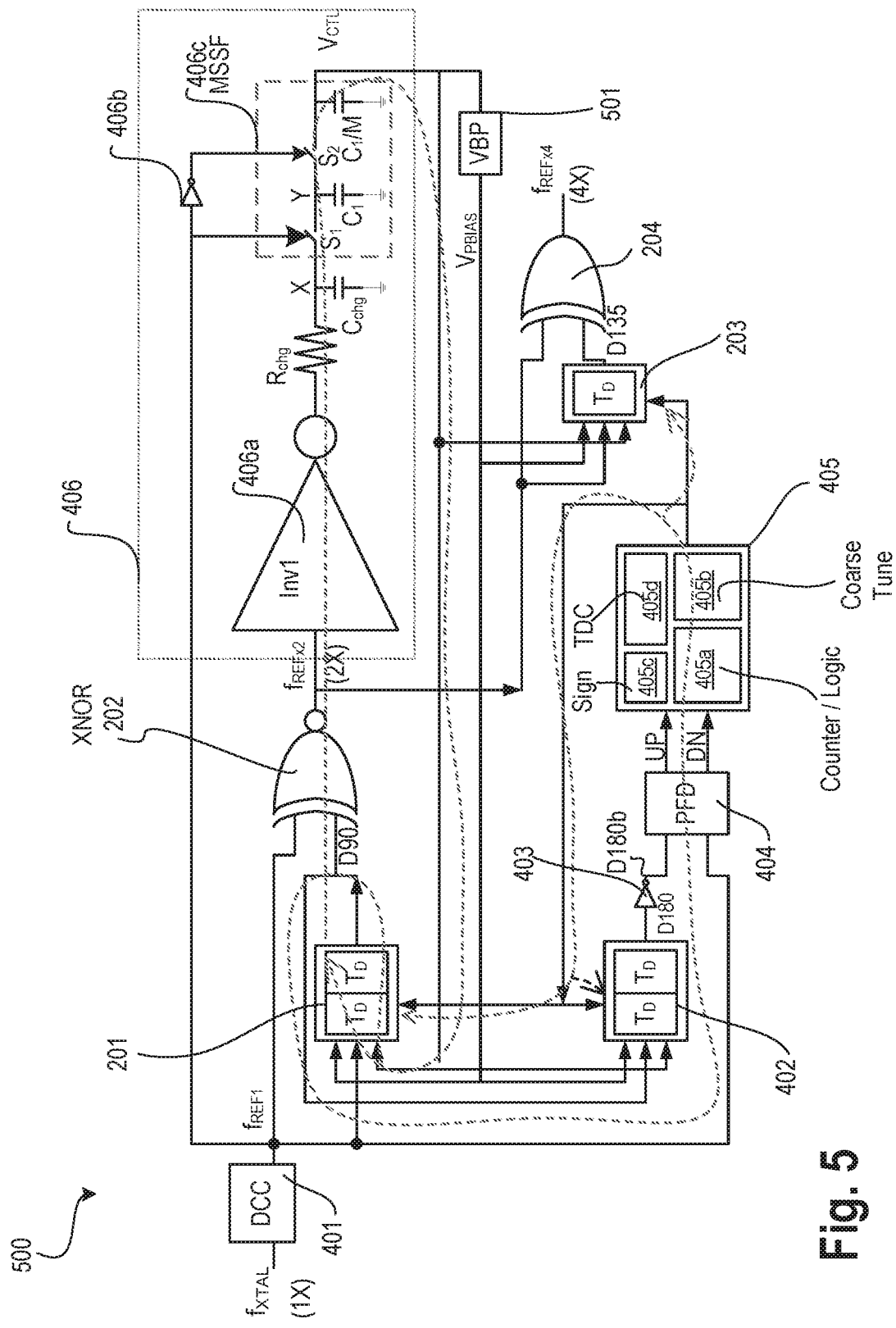
FIG. 5 illustrates a schematic of the multiplier, in accordance with some embodiments.

FIG. 5 illustrates schematic 500 of multiplier 102, in accordance with some embodiments. Schematic 500 illustrates delays of the two feedback loops comprising circuits 405 and 406. XNOR gate 202 compares $f_{REF1}$ and its delayed-by-$2T_D$ version to generate 2X $f_{REF}$ at $f_{REFx2}$. In various embodiments, voltage controlled delay line 201, which is also digitally programmable, controls the amount of $T_D$. In various embodiments, each voltage controlled delay line 201, 402, and 203 have voltage controlled ports and digitally programmable switches that are controlled by the outputs of circuitry 405 and/or circuitry 406.

The two dashed lines form the two feedback loops. One of the dashed line is a DLL-like feedback which comprises (i) the XNOR gate 202; (ii) a large inverter 406a; (iii) a master-slave sampling filter (MSSF) 406c that produces a nearly flat control voltage $V_{CTL}$ (that biases one or more degenerating n-type devices in the delay lines 201, 402, and 203); (iv) a PMOS-bias generator VBP 501 (that biases one or more degenerating p-type devices in the delay lines 201, 402, and 203); and (v) two $T_D$ in series 201. Called "DLL-like", this feedback comprises a phase detector PD, using XOR, or XNOR 202 plus inverter Inv1 406a, a loop filter (MSSF) 406c, and a delay line (2 $T_D$'s in series).

The other one of the dashed line is a digital tuning feedback, which includes an FSM (finite state machine) 405 that comprises counter/logic 405a, delay tuning logic 405b, UP/DN sign detector 405c, and time-to-digital converter (TDC) 405d. In some embodiments, logic and counter 405a that tune the delay elements (e.g., of delay-line 201, 402, and 203) based on average PE over multiple reference cycles of $f_{REF1}$. Counter 405a suggests a low-frequency pole in this loop. In some embodiments, delay tuning logic 405b determines how much delay to increase or decrease from each delay-line 201, 402, and 203. In some embodiments, UP/DN sign detector 405c is an error sign detection which determines whether the counter/logic 405a should count UP or DN. In some embodiments, TDC 405d digitizes the PE into a digital word (e.g., a multi-bit signature).

In some embodiments, inverter Inv1 406a is sized to have low pull-up and pull-down resistance during output switching. Therefore, at node X, charging and discharging time constants of inverter Inv1 406a are largely matched as they are dominated by $R_{chg}$ (e.g., 25 kohm) times $C_{chg}$ (e.g., 270 fF). As a result, the N-P ratio mismatch/variation between the large n-type and p-type device(s) inside Inv1 406a adds merely a fractional difference. Alternatively, in some embodiments, a charge pump (CP) with matched UP and DN currents can substitute Inv1 406a, charging/discharging node X when the level of $f_{REFx2}$ is HIGH/LOW, respectively.

In some embodiments, MSSF 406c has its internal node Y to track voltage at X when $f_{REF1}$ waveform is HIGH and passes/shares the last moment voltage at Y to Wm when $f_{REF1}$ waveform transitions from HIGH to LOW via switches S1 and S2, respectively, that are controlled by $f_{REF1}$ and its inverse by inverter 406b. As a result of MSSF 406a, $V_{CTL}$ at steady-state may have trivial ripples. Here, M is the scaler of the capacitance at node Y to the capacitance at node $V_{CTL}$, where M is typically greater than 10.

Figure 6A:
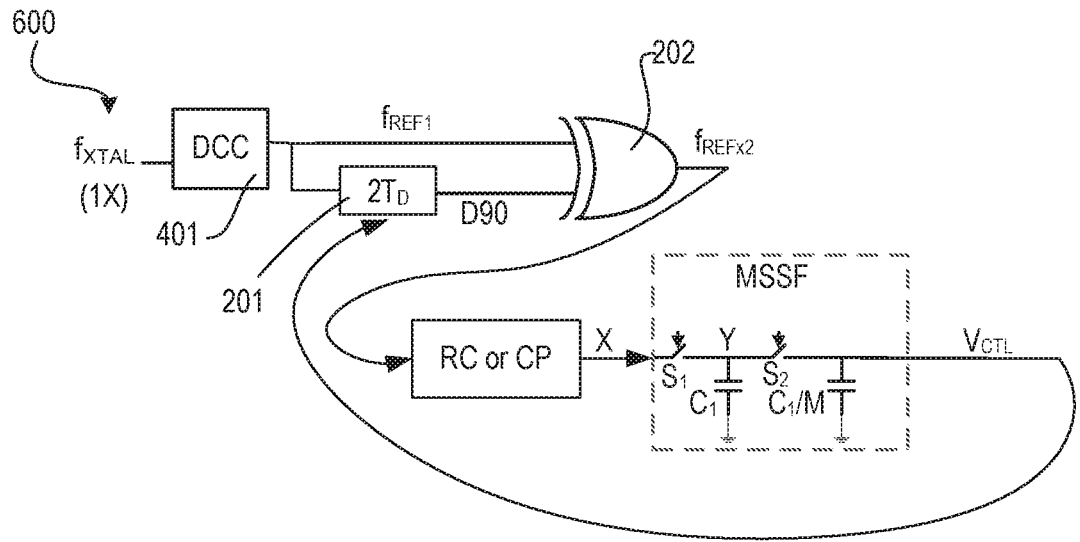
FIGS. 6A-B illustrate a simplified diagram of a delay locked loop (DLL) like feedback loop, and associated timing diagram, respectively, in accordance with some embodiments.
Figure 6B:
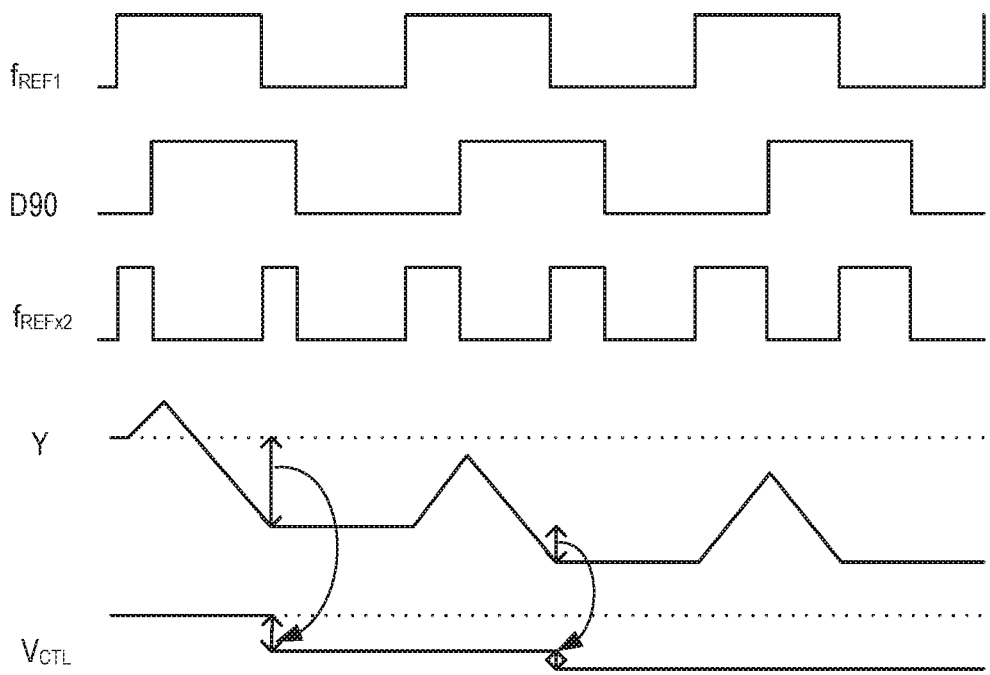

FIGS. 6A-B illustrate simplified diagram 600 of a delay locked loop (DLL) like feedback loop, and associated timing diagram 620, respectively, in accordance with some embodiments. The DLL-like feedback can be simplified as showing in FIGS. 6A-B while the waveforms using a charge pump is illustrated in the timing diagram 620. The duty cycle error of $f_{REFx2}$ leads to different charging and discharging duration. Timing diagram 620 illustrates how Wm settles and how $f_{REFx2}$ duty cycle converges toward 50%. Here, Y is the internal voltage of MSSF 406c.

FIGS. 7A-C illustrate a building block 700 for a bias generator 720 and a delay line 730, respectively, in accordance with some embodiments. The delay lines 201, 402, and 203, and VBP 501 can share the topology as 730 which is derived from 700 and comprises p-type transistors MP1 and MP2, and n-type transistors MN1 and MN2 coupled as shown. FIG. 7B shows VBP 501 that uses transistor MN2 as a current source and generates $V_{PBIAS}$. FIG. 7C shows how the delay line 201, 402, and/or 203 is built upon. The voltage swing in the delay line is rail-to-rail, in accordance with some embodiments. The degenerating transistors (MN2's and MP2's) improve supply noise rejection and reduce 1/f noise impact.

Figure 8:
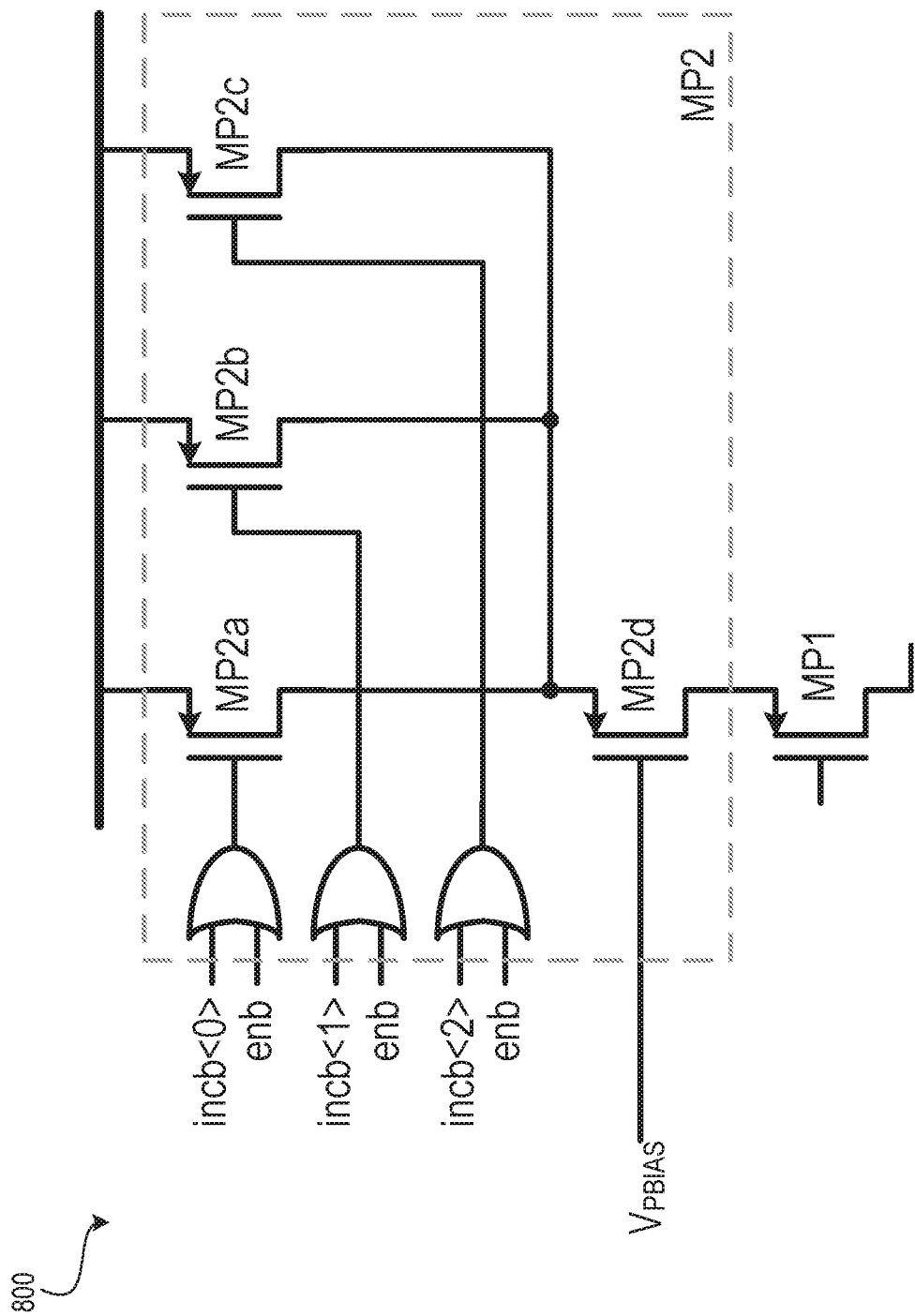
FIG. 8 illustrates a tunable complex-transistor for use in any one of the circuits of FIGS. 7A-C, in accordance with some embodiments.

FIG. 8 illustrates tunable complex-transistor 800 for use in any one of the circuits of FIGS. 7A-C, in accordance with some embodiments. For the digital tuning in the building block, one embodiment is illustrated in FIG. 8 for the p-type device part where transistor MP2 is a complex, rather than a single transistor. This allows enablement of different combinations of MP2a, MP2b, and MP2c by enb=LOW and incb<2:0> to degenerate MP2d whose gate is biased at $V_{PBIAS}$. Transistors MP2a, MP2b, and MP2c can have different stacking and/or different diffusion grids in parallel. While a complex transistor for MP2 is shown, the same can be achieved for the n-type device MN2. In some embodiments, the n-type counterpart may use AND gates instead of the OR gates, input enb become en (i.e., "enable"), and input incb<2:0> becomes inc<2:0>.

Table 1 summaries the reference frequency quadrupler's (e.g., multiplier 102) current consumption of 147 μA and 186 μA under a 0.8 V supply at cold (−40 C) and hot (125 C), respectively, including the 5 $T_D$'s, the 2× and 4× outputs, PFD 404, but without the FSM 405 which is run in the background and with a low activity.

TABLE 1

| Corner | Temperature (C.) | Current (A) normalized | 2x (Hz) | 4x (Hz) |
|---|---|---|---|---|
| Nominal | −40 | 1μ | 76.8M | 153.6M |
| Nominal | 125 | 1.26μ | 76.8M | 153.6M |

Table 2 compares the estimated area and current consumption of multiplier circuit 102 vs. digital LC (inductor-capacitor) control PLL (DLCPLL) and low-jitter PLL (LJPLL) in an advanced CMOS process technology node.

TABLE 2

|  | DLCPLL | LJPLL | Multiplier 102 |
|---|---|---|---|
| Area (μm²) | 44460 | 15350 | 1200 |
| Current (mA) | 15 | 1.8 | 0.35 |

Here the LJPLL uses a 38.4 MHz reference from crystal oscillator 101, runs integer-N mode for lower phase noise, has a VCO at 2.4 GHz, and outputs 100 MHz, delivering 2.6×$f_{REF}$ (as 100/38.4). The output jitter of the LJPLL can reduce if its VCO is set to a higher frequency or higher current, but not as low frequency as the frequency of the delay line based multiplier 102. The current consumption of quadrupler multiplier 102 includes the up-front DCC (duty cycle corrector) 401 and FSM 405 (containing TDC, PFD, counter, etc.) with a low activity factor. Quadrupler multiplier 102 can be part of a PLL IP.

Figure 9:
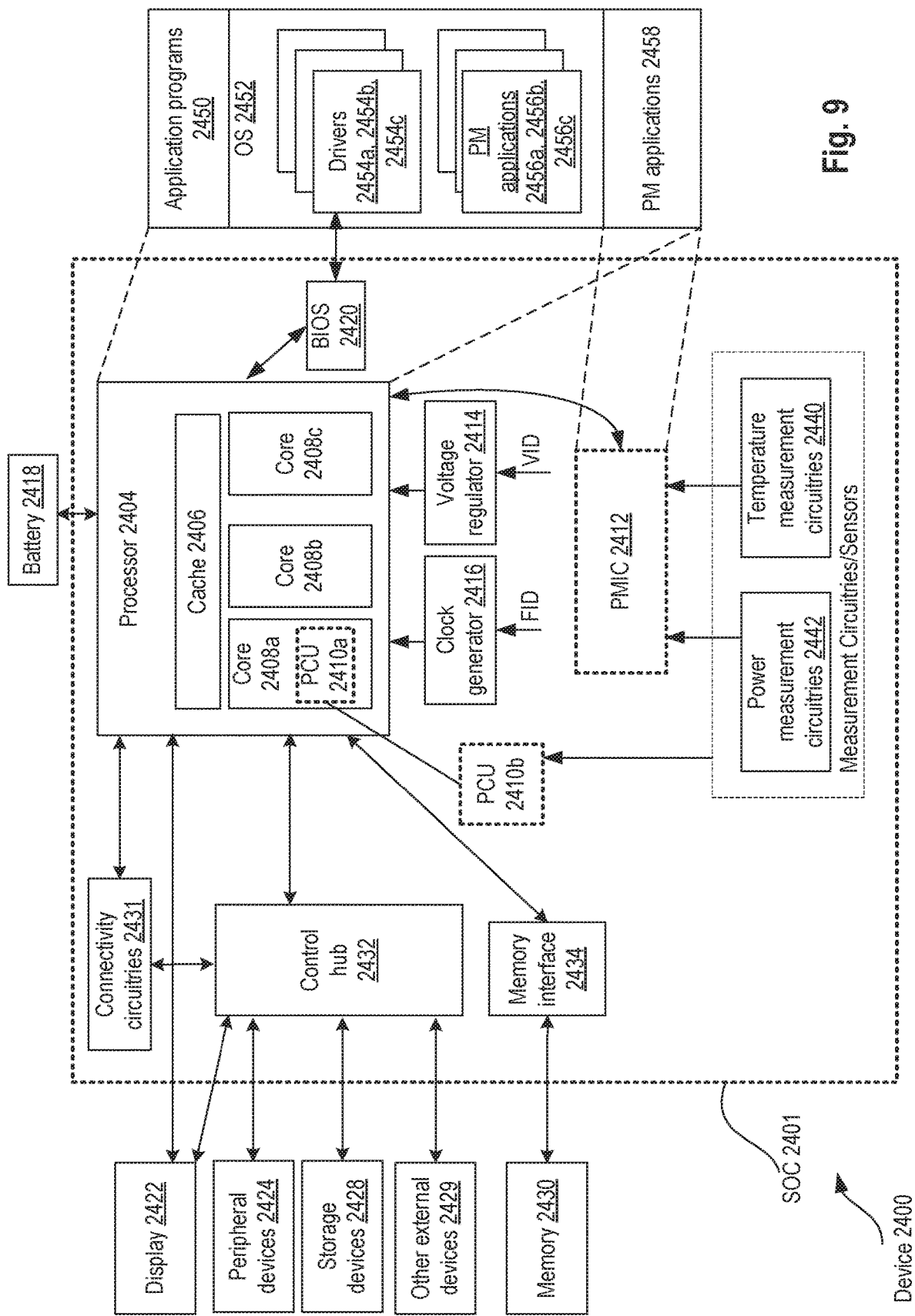
FIG. 9 illustrates a smart device or a computer system or an SoC (System-on-Chip) with a multiplier to increase a root reference clock frequency, in accordance with some embodiments.

FIG. 9 illustrates a smart device or a computer system or an SoC (System-on-Chip) with a multiplier to increase a root reference clock frequency, in accordance with some embodiments. It is pointed out that those elements of FIG. 9 having the same reference numbers (or names) as the elements of any other figure can operate or function in any manner similar to that described, but are not limited to such. Any of the blocks described here can have the multiplier to increase a root reference clock frequency.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 9, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408*a*, 2408*b*, 2408*c*. Although merely three cores 2408*a*, 2408*b*, 2408*c* are illustrated in FIG. 9, processor 2404 may include any other appropriate number of processing cores, e.g., tens, or even hundreds of processing cores. Processor cores 2408*a*, 2408*b*, 2408*c* may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410*a/b* and/or PMIC 2412. In some embodiments, each core has a network of distributed LDOs to provide efficient control for power management. The LDOs can be digital, analog, or a combination of digital or analog LDOs.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter. In some embodiments, battery 2418 includes logic for inference based fast charging.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400. In some embodiments, PMU 4410 includes logic for inference based fast charging.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400. In some embodiments, PMIC 2412 includes logic for inference based fast charging.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments described herein are illustrated as examples. The features of these examples can be combined with one another in any suitable way. These examples include:

Example 1: An apparatus comprising: a duty cycle correction (DCC) circuit to receive a first clock having a first frequency to generate an output which is substantially corrected for duty cycle error; and a multiplier circuitry coupled to the output of the DCC circuit, wherein the multiplier circuitry is to generate a second clock having a second frequency higher than the first frequency, wherein the multiplier circuitry includes: a delay line to delay the output of the DCC circuit, and to generate a phase shifted signal; and a comparator to compare the output of the DCC circuit and the phase shifted signal.

Example 2: The apparatus of example 1, wherein the delay line is a first delay line, wherein the phase shifted signal is a first phase shifted signal, and wherein the multiplier circuitry comprises a second delay line to delay the first phase shifted signal, and to generate a second phase shifted signal.

Example 3: The apparatus of example 2, wherein the multiplier circuitry comprises: an inverter to invert the second phase shifted signal; and a phase detector to receive an output of the inverter, and the output of the DCC circuit.

Example 4: The apparatus of example 3, wherein the multiplier circuitry comprises a finite state machine (FSM) to receive UP and Down signals of the phase detector and to generate one or more controls to control delays of the first and second delay lines in accordance with the UP and Down signals.

Example 5: The apparatus of example 4, wherein the comparator is a first comparator, and wherein the multiplier circuitry comprises: a third delay line to delay an output of the first comparator, and to generate a third phase shifted signal relative to the output of the DCC circuit; and a second comparator to compare the output of the first comparator and the third phase shifted signal.

Example 6: The apparatus of example 5, wherein the one or more controls to control delay of the third delay line in accordance with the UP and Down signals.

Example 7: The apparatus of example 6 comprises a bias generator to generate bias for the first, second and third delay lines.

Example 8: The apparatus of example 2, wherein the first and second delay lines have substantially a same delay.

Example 9: The apparatus of example 5, wherein the third delay line has substantially half a delay of the first or second delay lines.

Example 10: The apparatus of example 5, wherein the first and second comparators comprise XOR or XNOR gates.

Example 11: The apparatus of example 5, wherein the first, second, and third delay lines comprise one or more delay stages, wherein an individual delay stage includes degenerative n-type or p-type devices.

Example 12: An apparatus comprising: a duty cycle correction (DCC) circuit to receive a first clock having a first frequency to generate an output which is corrected for duty cycle error; and a multiplier circuitry coupled to the output of the DCC circuit, wherein the multiplier circuitry is to generate a second clock having a second frequency higher than the first frequency wherein the multiplier circuitry is independent of a phase locked loop.

Example 13: The apparatus of example 12, wherein the multiplier circuitry includes: a delay line to delay the output of the DCC circuit, and to generate a substantially 90 degree phase shifted signal; and an XOR gate to compare the output of the DCC circuit and the substantially 90 degree phase shifted signal.

Example 14: The apparatus of example 13, wherein the delay line is a first delay line, and wherein the multiplier circuitry comprises a second delay line to delay the substantially 90 degree phase shifted signal, and to generate a substantially 180 degree phase shifted signal.

Example 15: The apparatus of example 14, wherein the multiplier circuitry comprises: an inverter to invert the substantially 180 degree phase shifted signal; and a phase frequency detector to receive an output of the inverter, and the output of the DCC circuit.

Example 16: The apparatus of example 15, wherein the multiplier circuitry comprises a finite state machine (FSM) to receive a phase error from the phase frequency detector and to generate one or more bits to control delays of the first and second delay lines in accordance with the phase error.

Example 17: The apparatus of example 16, wherein the XOR gate is a first XOR gate, and wherein the multiplier circuitry comprises: a third delay line to delay an output of the first XOR gate, and to generate a substantially 135 degree phase shifted signal relative to the output of the DCC circuit; and a second XOR gate to compare the output of the first XOR gate and the substantially 135 phase shifted signal.

Example 18: The apparatus of example 17, wherein: the one or more bits to control delay of the third delay line in accordance with the phase error; the first and second delay lines have substantially a same delay; and the third delay line has substantially half a delay of the first or second delay lines.

Example 19: A system comprising: a crystal oscillator to generate a first clock having a first frequency; a memory; a processor coupled to the memory; and a wireless interface to allow the processor to communicate with another device, wherein the processor includes: a duty cycle correction (DCC) circuit to receive the first clock to generate an output which is corrected for duty cycle error; and a multiplier circuitry coupled to the output of the DCC circuit, wherein the multiplier circuitry is to generate a second clock having a second frequency higher than the first frequency, wherein the multiplier circuitry includes: a delay line to delay the output of the DCC circuit, and to generate a phase shifted signal; and a comparator to compare the output of the DCC circuit and the phase shifted signal.

Example 20: The system of example 19 comprises a phase locked loop to receive the second clock as a reference clock.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a duty cycle correction (DCC) circuit to receive a first clock having a first frequency to generate an output which is substantially corrected for duty cycle error; and
a multiplier circuitry coupled to the output of the DCC circuit, wherein the multiplier circuitry is to generate a second clock having a second frequency higher than the first frequency, wherein the multiplier circuitry includes:
a delay line to delay the output of the DCC circuit, and to generate a phase shifted signal; and
a comparator to compare the output of the DCC circuit and the phase shifted signal wherein the delay line is a first delay line, the phase shifted signal is a first phase shifted signal, and the multiplier circuitry comprises a second delay line to delay the first phase shifted signal and generate a second phase shifted signal, an inverter to invert the second phase shifted signal, and a phase detector to receive an output of the inverter, and the output of the DCC circuit.

2. The apparatus of claim 1, wherein the multiplier circuitry comprises a finite state machine (FSM) to receive UP and Down signals of the phase detector and to generate one or more controls to control delays of the first and second delay lines in accordance with the UP and Down signals.

3. The apparatus of claim 2, wherein the comparator is a first comparator, and wherein the multiplier circuitry comprises:
a third delay line to delay an output of the first comparator, and to generate a third phase shifted signal relative to the output of the DCC circuit; and
a second comparator to compare the output of the first comparator and the third phase shifted signal.

4. The apparatus of claim 3, wherein the one or more controls to control delay of the third delay line in accordance with the UP and Down signals.

5. The apparatus of claim 4 comprises a bias generator to generate bias for the first, second and third delay lines.

6. The apparatus of claim 1, wherein the first and second delay lines have substantially a same delay.

7. The apparatus of claim 3, wherein the third delay line has substantially half a delay of the first or second delay lines.

8. The apparatus of claim 3, wherein the first and second comparators comprise XOR or XNOR gates.

9. The apparatus of claim 3, wherein the first, second, and third delay lines comprise one or more delay stages, wherein an individual delay stage includes degenerative n-type or p-type devices.

10. An apparatus comprising:
a duty cycle correction (DCC) circuit to receive a first clock having a first frequency to generate an output which is corrected for duty cycle error; and
a multiplier circuitry coupled to the output of the DCC circuit, wherein the multiplier circuitry is to generate a second clock having a second frequency higher than the first frequency, wherein the multiplier circuitry is independent of a phase locked loop, and wherein the multiplier circuitry includes:
a first delay line to delay the output of the DCC circuit and generate a substantially 90 degree phase shifted signal,
an XOR gate to compare the output of the DCC circuit and the substantially 90 degree phase shifted signal, a second delay line to delay the substantially 90 degree phase shifted signal and generate a substantially 180 degree phase shifted signal, an inverter to invert the substantially 180 degree phase shifted signal; and a phase frequency detector to receive an output of the inverter, and the output of the DCC circuit.

11. The apparatus of claim 10, wherein the multiplier circuitry comprises a finite state machine (FSM) to receive a phase error from the phase frequency detector and to generate one or more bits to control delays of the first and second delay lines in accordance with the phase error.

12. The apparatus of claim 11, wherein the XOR gate is a first XOR gate, and wherein the multiplier circuitry comprises:

a third delay line to delay an output of the first XOR gate, and to generate a substantially 135 degree phase shifted signal relative to the output of the DCC circuit; and a second XOR gate to compare the output of the first XOR gate and the substantially 135 phase shifted signal.

13. The apparatus of claim 12, wherein:

the one or more bits to control delay of the third delay line in accordance with the phase error;

the first and second delay lines have substantially a same delay; and the third delay line has substantially half a delay of the first or second delay lines.

14. A system comprising:

a crystal oscillator to generate a first clock having a first frequency;

a memory;

a processor coupled to the memory; and a wireless interface to allow the processor to communicate with another device, wherein the processor includes:

a duty cycle correction (DCC) circuit to receive the first clock to generate an output which is corrected for duty cycle error; and a multiplier circuitry coupled to the output of the DCC circuit, wherein the multiplier circuitry is to generate a second clock having a second frequency higher than the first frequency, wherein the multiplier circuitry includes:

a delay line to delay the output of the DCC circuit, and to generate a phase shifted signal; and a comparator to compare the output of the DCC circuit and the phase shifted signal, wherein the delay line is a first delay line, the phase shifted signal is a first phase shifted signal, and the multiplier circuitry comprises a second delay line to delay the first phase shifted signal and generate a second phase shifted signal, an inverter to invert the second phase shifted signal, and a phase detector to receive an output of the inverter, and the output of the DCC circuit.

15. The system of claim 14 comprises a phase locked loop to receive the second clock as a reference clock.

* * * * *